United States Patent
Lee et al.

(10) Patent No.: US 7,960,273 B2
(45) Date of Patent: Jun. 14, 2011

(54) METAL INTERCONNECTION OF A SEMICONDUCTOR DEVICE AND METHOD OF MANUFACTURING THE SAME

(75) Inventors: Kyu-Ha Lee, Yongin-si (KR); Cha-Je Jo, Bucheon-si (KR); Jeong-Woo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 147 days.

(21) Appl. No.: 12/292,827

(22) Filed: Nov. 26, 2008

(65) Prior Publication Data
US 2009/0140429 A1    Jun. 4, 2009

(30) Foreign Application Priority Data
Nov. 29, 2007   (KR) .................. 10-2007-0123005

(51) Int. Cl.
*H01L 21/44* (2006.01)
*H01L 21/4763* (2006.01)
(52) U.S. Cl. ........................ 438/614; 438/637
(58) Field of Classification Search .............. 438/614
See application file for complete search history.

(56) References Cited

U.S. PATENT DOCUMENTS

| | | | | |
|---|---|---|---|---|
| 3,429,029 A * | 2/1969 | Langdon et al. | | 438/614 |
| 5,969,422 A * | 10/1999 | Ting et al. | | 257/762 |
| 6,586,322 B1 * | 7/2003 | Chiu et al. | | 438/612 |
| 7,427,557 B2 * | 9/2008 | Rinne et al. | | 438/612 |
| 2003/0042610 A1 * | 3/2003 | Kitada et al. | | 257/758 |
| 2005/0250321 A1 * | 11/2005 | Hwang | | 438/672 |
| 2005/0269206 A1 | 12/2005 | Tanaka et al. | | |
| 2008/0188071 A1 * | 8/2008 | Lee et al. | | 438/614 |

FOREIGN PATENT DOCUMENTS

| | | |
|---|---|---|
| JP | 05-074780 | 3/1993 |
| JP | 2006-024902 | 1/2006 |
| JP | 2006-135058 | 5/2006 |
| KR | 10-2006-0048174 A | 5/2006 |

OTHER PUBLICATIONS

Radzimski, Z "Directional copper deposition using dc magnetron self-sputtering" J. Vac. Sci. Technol. B 16 (3) May/Jun. 1998 pp. 1102-1106.*

* cited by examiner

*Primary Examiner* — N Drew Richards
*Assistant Examiner* — Grant S Withers
(74) *Attorney, Agent, or Firm* — Lee & Morse, P.C.

(57) ABSTRACT

A method of manufacturing a metal interconnection of a semiconductor device includes forming a base layer with at least one groove, the at least one groove having an open upper portion, forming a first metal layer in the at least one groove, forming a seed metal layer on the first metal layer in the at least one groove, the seed metal layer being only on a bottom surface of the at least one groove, and forming a metal pattern grown from the seed metal layer to fill the at least one groove.

17 Claims, 6 Drawing Sheets

METAL INTERCONNECTION OF A SEMICONDUCTOR DEVICE AND METHOD OF MANUFACTURING THE SAME

CROSS-REFERENCE TO RELATED APPLICATION

Korean Patent Application No. 10-2007-0123005, filed on Nov. 29, 2007, in the Korean Intellectual Property Office, and entitled: "Metal Interconnection of Semiconductor Device and Method of Manufacturing the Same," is incorporated by reference herein in its entirety.

BACKGROUND

Semiconductor devices are becoming miniaturized, e.g., microminiaturized, and lightweight, e.g., ultra lightweight, by increasing an integration degree of the semiconductor devices. As a semiconductor device is highly integrated, its design rule may decrease. As the design rule decreases, the width and thickness of a metal interconnection in the semiconductor device may be reduced. As a result, however, resistance of the metal interconnection may increase.

Attempts have been made to reduce the resistance of the metal interconnections by using materials having low specific resistance. Materials having low specific resistance, however, may include many limitations. For example, materials having low specific resistance may cause parasitic capacitance between the metal interconnections, thereby reducing reliability of the metal interconnection and of the semiconductor device. Further, some materials having low specific resistance may increase manufacturing costs of the metal interconnections, thereby reducing productivity of the semiconductor device. Therefore, there exists a need for metal interconnections exhibiting improved reliability and operability.

SUMMARY

Example embodiments relate to a semiconductor device and a method of manufacturing the same. More particularly, example embodiments relate to a metal interconnection of a semiconductor device and a method of manufacturing the same.

Example embodiments are therefore directed to a semiconductor device and a method of manufacturing the same, which substantially overcome one or more of the disadvantages of the related art.

It is therefore a feature of an example embodiment to provide a metal interconnection of a semiconductor device and a method of manufacturing the same with improved reliability.

It is another feature of an example embodiment to provide a metal interconnection of a semiconductor device and a method of manufacturing the same with improved operation characteristics.

It is yet another feature of an example embodiment to provide a metal interconnection of a semiconductor device and a method of manufacturing the same with improved productivity.

It is still another feature of an example embodiment to provide an electronic device with a metal interconnection exhibiting one or more of the above features.

At least one of the above and other features and advantages may be realized by providing a method of manufacturing a metal interconnection of a semiconductor device, the method including forming a base layer with at least one groove, the at least one groove having an open upper portion, forming a first metal layer in the at least one groove, forming a seed metal layer on the first metal layer in the at least one groove, the seed metal layer being only on a bottom surface of the at least one groove, and forming a metal pattern grown from the seed metal layer to fill the at least one grove. A metal interconnection of a semiconductor device may be manufactured by using the method above.

The method may further include forming an electrode on a substrate, forming the base layer with the at least one groove on the substrate, the groove being formed through the mold layer to expose an upper surface of the electrode, and forming the first metal layer conformally on a bottom surface and sidewalls of the at least one groove, the first metal layer contacting the electrode. Forming the seed metal layer may include forming a preliminary seed metal layer on the first metal layer, forming a sacrificial pattern to fill the at least one groove, selectively removing a portion of the preliminary seed metal layer using the sacrificial pattern as an etch mask to form the seed metal layer only on the bottom surface of the at least one groove, and removing the sacrificial pattern from the seed metal layer. The preliminary seed metal layer may have an etching selectivity relative to the first metal layer and the sacrificial pattern. Selectively removing the portion of the preliminary seed metal layer may include forming the seed metal layer on the bottom surface of the at least one groove and spaced apart from both sidewalls of the groove. Removing the portion of the preliminary seed metal layer may include completely removing the preliminary seed metal layer from both sidewalls of the at least one groove to expose a portion of the first metal layer on the bottom surface of the groove, the exposed portion of the first metal layer defining a space between the seed metal layer and the sidewalls of the groove.

Forming the sacrificial pattern may include forming a sacrificial layer on the preliminary seed metal layer to fill the at least one groove, and selectively removing a portion of the sacrificial layer to expose a horizontal portion of the preliminary seed metal layer, the horizontal portion of the preliminary seed metal layer being on the base layer and external to the groove. Forming the sacrificial pattern may include forming the sacrificial layer by depositing a non-photosensitive material on the preliminary seed metal layer, and removing a portion of the non-photosensitive material to expose the horizontal portion of the preliminary seed metal layer, the sacrificial pattern being only within the groove, and an upper surface of the sacrificial pattern being substantially coplanar with an upper surface of the horizontal portion of the preliminary seed metal layer. Forming the sacrificial pattern may include forming the sacrificial layer by depositing a photosensitive material on the preliminary seed metal layer, and removing a portion of the photosensitive material to expose the horizontal portion of the preliminary seed metal layer, the sacrificial pattern extending beyond the groove to overlap a part of the horizontal portion of preliminary seed metal layer.

Forming the metal pattern may include growing the metal pattern from the seed metal layer by using an electroplating method or an electroless plating method. The method may further include removing a portion of the first metal layer to form a conductive pattern surrounding a lower portion and side portions of the metal pattern. The conductive pattern may be formed of one or more of titanium (Ti), titanium nitride (TiN), tungsten (W), tungsten nitride (WN), tantalum (Ta), tantalum nitride (TaN), and rubidium (Rb), and the metal pattern is formed of one or more of copper (Cu), nickel (Ni), and gold (Au). Forming the base layer may include using a non-photosensitive material or a photosensitive material.

The first metal layer may be formed of a first metal, the seed metal layer may be formed of a second metal different from the first metal, and the metal pattern in the groove may be formed to be surrounded by the first metal layer within the groove. Forming the seed metal layer may include forming a second metal layer on the first metal layer, forming a mask pattern to cover a portion of the second metal layer on the bottom surface of the groove, selectively removing a portion of the second metal layer using the mask pattern as an etch mask to form the seed metal layer under the mask pattern, and removing the mask pattern. The second metal layer may have an etching selectivity relative to the first metal layer and the mask pattern. Forming the metal pattern may include plate-growing the second metal from the seed metal layer toward the open upper portion of the groove.

Forming the seed metal layer only on the bottom surface of the at least one groove may include forming the seed metal layer to have a width smaller than a width of the bottom surface of the groove, the widths of the seed metal layer and bottom surface of the groove being measured along a horizontal direction. Forming the metal pattern in the groove may include forming the metal pattern to surround at least three surfaces of the seed metal layer, a portion of the metal pattern being on the bottom surface of the groove between the seed metal layer and a sidewall of the groove.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF EMBODIMENTS

Figure 1:
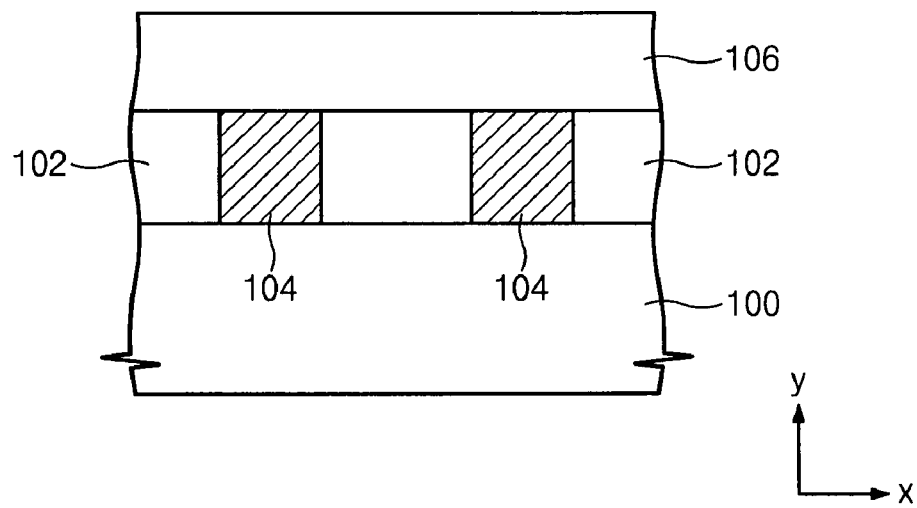
FIGS. 1-8 illustrate cross-sectional views of sequential stages in a method of manufacturing a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

FIGS. 1-8 illustrate cross-sectional views of sequential stages in a method of manufacturing metal interconnections of a semiconductor device according to an example embodiment.

Referring to FIG. 1, a dielectric layer 102 including an electrode 104 may be formed on a substrate 100. For example, as illustrated in FIG. 1, the dielectric layer 102 may be formed directly on the substrate 100, and may include a plurality of portions spaced apart from each other to expose an upper surface of the substrate 100. The electrode 104 may be formed on the substrate 100 between adjacent portions of the dielectric layer 102, e.g., one portion of the electrode 104 may be directly on the substrate 100 between two adjacent portions of the dielectric 102. The substrate 100 may be any suitable substrate, e.g., a semiconductor substrate. The dielectric layer 102 may include any suitable dielectric material, e.g., the dielectric layer 102 may include a silicon layer. The electrode 104 may be formed of, e.g., a conductive material, and may include a chip pad and a penetration electrode electrically connected to the chip pad. The electrode 104 may include a gate electrode and a lower interconnection.

A mold layer 106 may be formed on the dielectric layer 102, so the dielectric layer 102 may be between the substrate 100 and the mold layer 106. For example, the mold layer 106 may be formed of a photosensitive material or a non-photosensitive material. When the mold layer 106 is formed of a photosensitive material, the mold layer 106 may include a photoresist, and may be formed, e.g., using a spin coating method. When the mold layer 106 is formed of a non-photosensitive material, the mold layer 106 may include, e.g., one or more of an oxide layer, a nitride layer, and a polymer, and may be formed using, e.g., a chemical vapor deposition (CVD) method or a physical vapor deposition (PVD) method.

Figure 2:
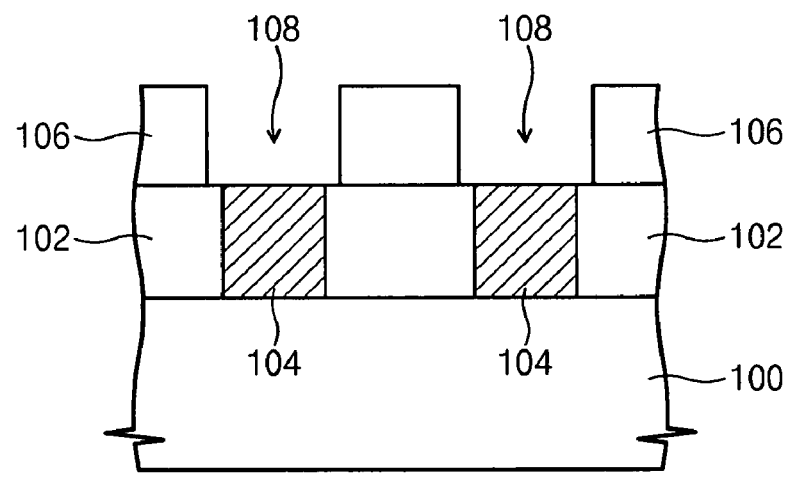

Referring to FIG. 2, a groove 108 may be formed through the mold layer 106 to expose the electrode 104, e.g., the groove 108 may be defined between adjacent portions of the mold layer 106. The groove 108 may overlap the electrode 104, e.g., completely overlap the electrode 104. For example, a width of the groove 108 may be larger than a width of a corresponding electrode 104 along a horizontal direction, e.g., the x-axis, so the groove 108 may expose a portion of an upper surface of the dielectric layer 102. For example, the electrode 104 may be centered with respect to the width of the groove 108 along the horizontal direction. When the mold layer 106 is formed of a photosensitive material, the groove 108 may be formed, e.g., using a photo process. When the mold layer 106 is formed of a non-photosensitive material, the groove 108 may be formed, e.g., using a patterning process.

Figure 3:
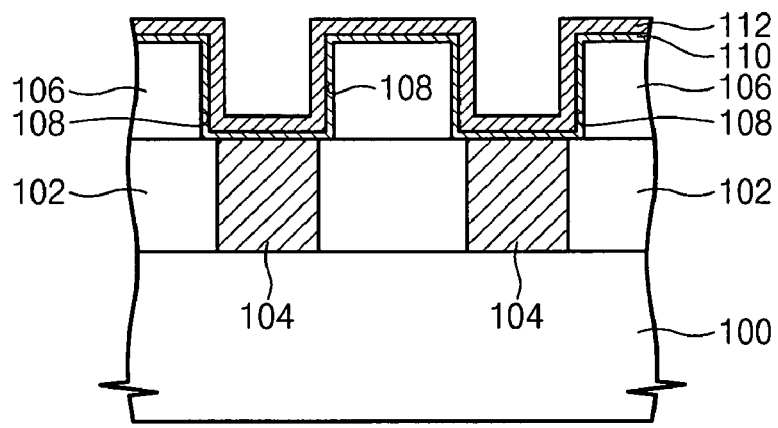

Referring to FIG. 3, a conductive layer 110 may be conformally formed on the mold layer 106 including the groove 108, i.e., on bottom and side surfaces of the groove 108 and on an upper surface of the mold layer 106, so a portion of the conductive layer 110 may be on the electrode 104. The term "conformally" corresponds to a layer formed with a uniform thickness or substantially uniform thickness along a profile of an underlying layer or structure. The conductive layer 110 may be formed using the PVD method, e.g., a sputtering process, the CVD method, or an electroless plating (ELP) method. The conductive layer 110 may be formed of, e.g., one or more of titanium (Ti), titanium nitride (TiN), tungsten (W), tungsten nitride (WN), tantalum (Ta), tantalum nitride (TaN), rubidium (Rb), and combinations thereof. The conductive layer 110 may supply current to a seed metal layer (112a of FIG. 6) formed in a subsequent process.

A preliminary seed metal layer 112 may be conformally formed on the conductive layer 110, e.g., directly on the entire conductive layer 110, so the conductive layer 110 may be between the preliminary seed metal layer 112 and the groove 108. The preliminary seed metal layer 112 may be formed using the PVD method, e.g., the sputtering process, the CVD method, or the ELP method. The preliminary seed metal layer 112 may exhibit a wet etching selectivity relative to the conductive layer 110. The preliminary seed metal layer 112 may be formed of, e.g., one or more of nickel (Ni), copper (Cu), and gold (Au).

Figure 4:
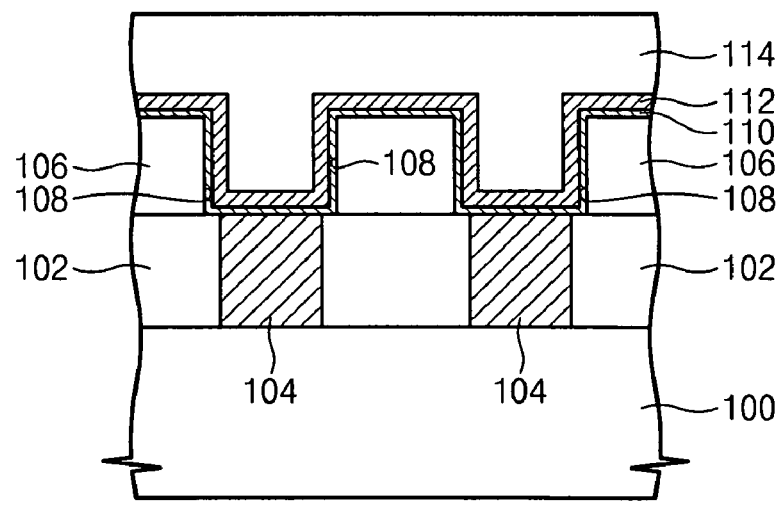

Referring to FIG. 4, a sacrificial layer 114 may be formed on the preliminary seed metal layer 112 to cover the groove 108. For example, the sacrificial layer 114 may completely fill the groove 108 and cover upper surfaces of the preliminary seed metal layer 112 between adjacent grooves 108. The sacrificial layer 114 may exhibit a wet etching selectivity relative to the preliminary seed metal layer 112. The sacrificial layer 114 may be formed of a non-photosensitive material, e.g., may include one or more of an oxide layer, a nitride layer, and a polymer, and may be formed using, e.g., the CVD method or the PVD method. It is noted that the sacrificial layer 114 of the metal interconnection may be formed of a photosensitive material, e.g., may include a photoresist and may be formed by the spin coating method, as will be described in more detail below with reference to FIG. 9.

Figure 5:
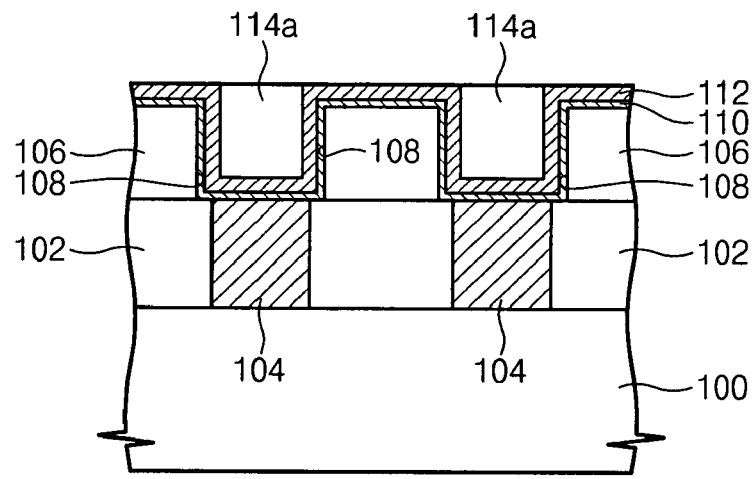

Referring to FIG. 5, an upper portion of the sacrificial layer 114 may be removed to expose the upper surfaces of the preliminary seed metal layer 112 between adjacent grooves 108. In other words, the upper portion of the sacrificial layer 114 may be removed to define a sacrificial pattern 114a in the groove 108, such that an upper surface of the sacrificial pattern 114a may be substantially level, i.e., coplanar, with the upper surfaces, i.e., exposed surfaces, of the preliminary seed metal layer 112 between adjacent grooves 108. It is noted that exposed surfaces of the preliminary seed metal layer 112 between adjacent grooves 108 may be used interchangeably with "horizontal portions of the preliminary seed metal layer 112." When the sacrificial layer 114 is formed of a non-photosensitive material, the sacrificial layer 114 may be etched using a dry etching process, e.g., an etch-back process. The sacrificial pattern 114a may be limited within the groove 108.

Figure 6:
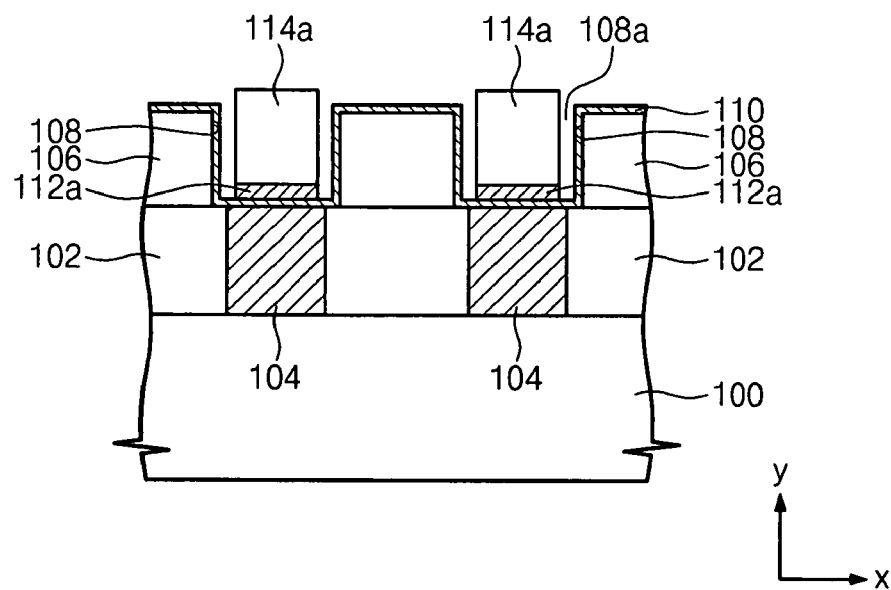

Referring to FIG. 6, the preliminary seed metal layer 112, i.e., exposed upper surfaces of the preliminary seed metal layer 112 and portions of the preliminary seed metal layer 112 on both sidewalls of the groove 108, may be selectively etched, e.g., by a wet etching process, to form a seed metal layer 112a on a bottom surface of the groove 108. For example, the preliminary seed metal layer 112 may be etched, i.e., portions thereof may be removed, to form the seed metal layer 112a limited to the bottom surface of the groove 108, i.e., the seed metal layer 112a may be between the bottom surface of the groove 108 and the sacrificial pattern 114a. The conductive layer 110 and the sacrificial pattern 114a may be used as an etch mask when etching the preliminary seed metal layer 112. For example, the preliminary seed metal layer 112 may be formed of copper (Cu), the conductive layer 110 and the sacrificial pattern 114a may be formed of titanium (Ti) and a non-photosensitive material, respectively, and an etching solution may include, e.g., sulfuric acid ($H_2SO_4$) and hydrogen peroxide ($H_2O_2$), capable of selectively etching the preliminary seed metal layer 112.

Portions of the preliminary seed metal layer 112 on both sidewalls of the groove 108, i.e., surfaces of the groove 108 along the vertical direction, may be removed to expose the conductive layer 110 on the bottom surface of the groove 108. In other words, an opening trench 108a may be formed along an entire height, i.e., along the vertical direction, of the groove 108 along the sacrificial pattern 114a and the metal layer 112 to expose a portion of the conductive layer 110 on the bottom surface of the groove 108. Thus, as illustrated in FIG. 6, the seed metal layer 112a may be spaced apart from the sidewalls of the groove 108 along the horizontal direction. In other words, as illustrated in FIG. 6, a bottom portion of the opening 108a may be between the seed metal layer 112a and an adjacent sidewall of the groove 108 along the horizontal direction, e.g., the seed metal layer 112a may have a smaller width than the groove 108 along the horizontal direction. For example, the seed metal layer 112a may completely overlap the bottom of the sacrificial pattern 114a, i.e., only the bottom of the sacrificial pattern 114a, so side surfaces of the seed metal layer 112a and the sacrificial pattern 114a may be substantially coplanar along a vertical plane, i.e., a plane including the y-axis. In other words, the seed metal layer 112a and the sacrificial pattern 114a may substantially overlap each other and have equal widths along the horizontal direction. The seed metal layer 112a may be centered in the groove 108.

Figure 7:
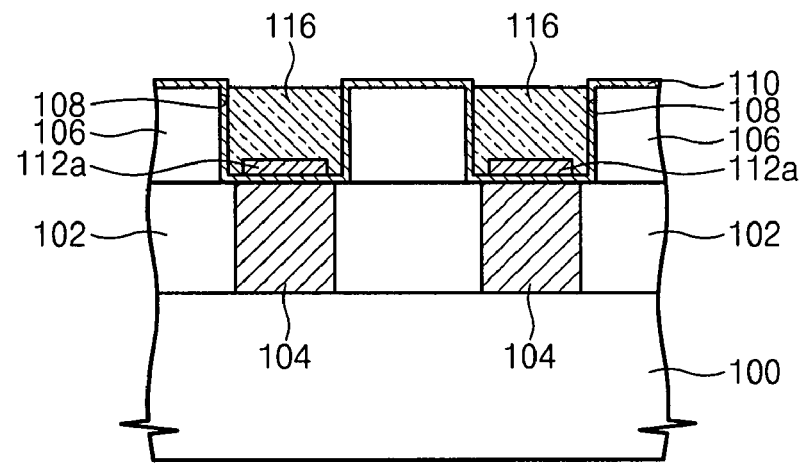

Referring to FIG. 7, the sacrificial pattern 114a may be removed from the groove 108, e.g., completely removed, to expose an upper surface of the seed metal layer 112a, i.e., a surface facing away from the electrode 104. A metal pattern 116 may be grown from the exposed seed metal layer 112a. The metal pattern 116 may be formed, e.g., using an electroplating method or the ELP method. The metal pattern 116 may be grown from the bottom surface of the groove 108, i.e., from the seed metal layer 112a, to fill the groove 108. For example, the metal pattern 116 may surround at least three surfaces of the seed metal layer 112a, so a portion of the metal pattern 116 may be directly on the bottom surface of the groove, e.g., between the seed metal layer 112a and the sidewall of the groove 108. The metal pattern 116 may have a wet etching selectivity relative to the conductive layer 110. The metal pattern 116 may be formed of a substantially same material as the seed metal layer 112a, e.g., one or more of copper (Cu), nickel (Ni), and gold (Au).

A photoresist pattern (not shown) exposing the groove 108 may be further formed before forming the metal pattern 116. The photoresist pattern may prevent or substantially minimize formation of the metal pattern 116 on horizontal portions of the conductive layer 110, i.e., portions of the conductive layer 110 extending between adjacent grooves 108.

Selective etching of the preliminary seed metal layer 112 to form the seed metal layer 112a to entirely overlap the sacrificial pattern 114a and have a substantially same width as the sacrificial pattern 114a may facilitate growth of the metal pattern 116 thereon without etching the seed metal layer 112a. As such, an under-cut phenomenon in a lower portion of the metal pattern 116 may be prevented or substantially minimized. In contrast, if the metal layer is wider than the sacrificial pattern 114a along the horizontal direction, etching, e.g., wet etching, may be required to remove a portion of the metal to align the metal layer with a lower portion of the metal pattern 116, thereby causing under-cutting in a lower portion of the metal pattern.

Figure 8:
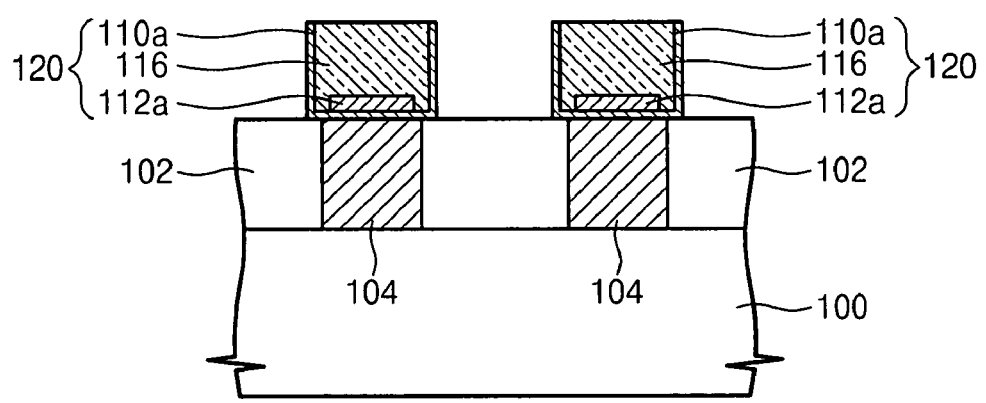

Referring to FIG. 8, the mold layer 106 and horizontal portions of the conductive layer 110 thereon may be removed to complete the metal interconnection 120. The removing process of the conductive layer 110 may include the wet etching process. For example, when the conductive layer 110 is formed of Ti, and the metal pattern 116 is formed of Cu, an etching solution may include hydrofluoric acid (HF) capable of selectively etching Ti. According to an example embodiment, use of wet etching to remove the horizontal portions of the conductive layer 110 may be performed instead of a chemical mechanical polishing (CMP) process, thereby reducing manufacturing costs. The removing process of the mold layer 106 may be performed by an ashing process, e.g., when the mold layer 106 is formed of a photosensitive material, the wet etching process described previously, e.g., when the mold layer 106 is formed of the non-photosensitive material, and so forth.

The metal interconnection 120 may include the seed metal layer 112a, the metal pattern 116, and a conductive pattern 110a. The conductive pattern 110a may be in contact with the seed metal layer 112a. The conductive pattern 110a may surround a lower portion and both sidewalls of the metal pattern 116, e.g., may be entirely in direct contact with at least three surfaces of the metal pattern 116 to expose an upper surface of the metal pattern 116. For example, the conductive pattern 110a may extend along entire sidewalls of the metal pattern 116, e.g., an upper surface of the metal pattern 116 may be substantially coplanar with upper surfaces of terminal edges of the conductive pattern 110a, i.e., surfaces of edges facing away from the dielectric layer 102. If the upper surface of the metal pattern 116 is exposed, the exposed metal pattern 116 may be capped by a silicon nitride layer (not shown) serving as an upper diffusion barrier layer. The conductive pattern 110a may be used as a lower diffusion barrier layer. For example, when the seed metal layer 112a and the metal pattern 116 are formed of Cu, and the conductive pattern 110a is formed of Ti, the conductive pattern 110a may prevent diffusion of copper ions into the electrode 104 and/or the dielectric layer 102. As a result, parasitic capacitance between adjacent metal interconnection 120 may be reduced. According to an example embodiment, time delay due to parasitic capacitance components may be reduced, and operation characteristics of a semiconductor device including the metal interconnection 120 may be improved.

According to another example embodiment, metal interconnections of a semiconductor device may be formed according to the substantially same process described previously with reference to FIGS. 1-8, with the exception of forming the sacrificial layer 114 of a photosensitive material. Thus, only formation of a sacrificial pattern 114b will be described herein with reference to FIG. 9.

Figure 9:
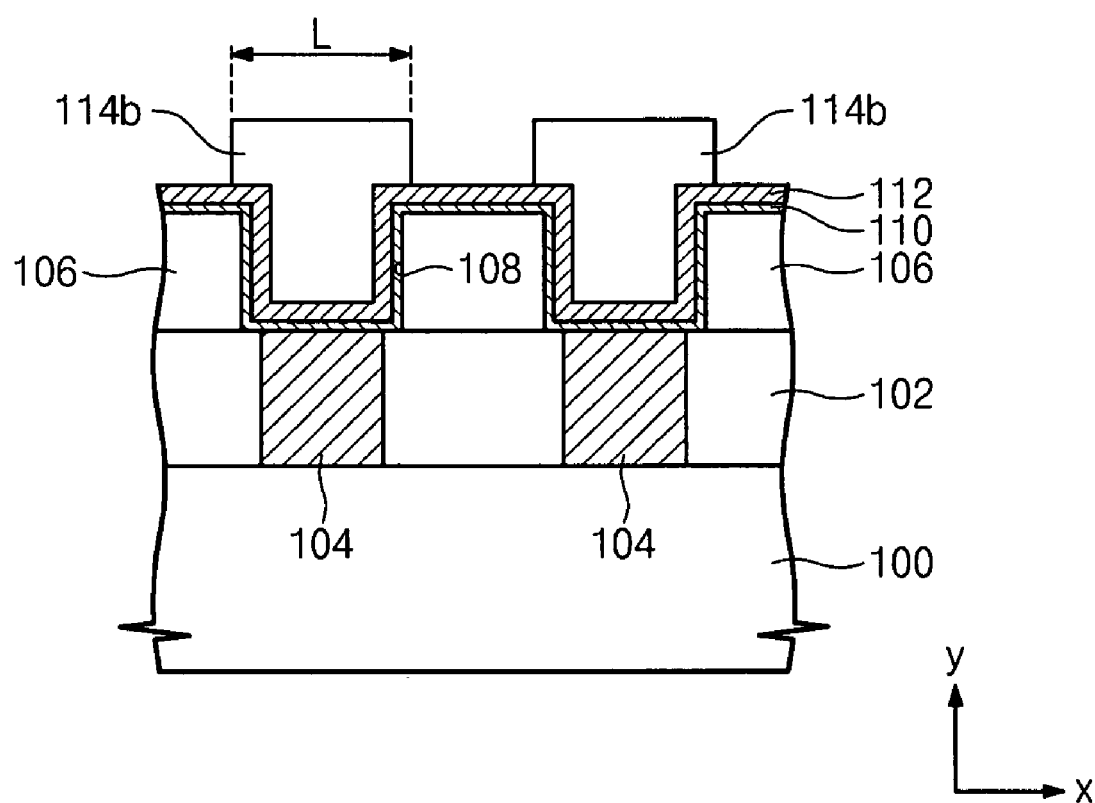
FIG. 9 illustrates a cross-sectional view of a stage in a method of manufacturing a semiconductor device according to another example embodiment.

More specifically, substantially same stages described previously with reference to FIGS. 1-4 may be performed, with the exception of forming the sacrificial layer 114 of a photosensitive material. Next, as illustrated in FIG. 9, a photo process may be performed on the sacrificial layer 114 to form the sacrificial pattern 114b.

The sacrificial pattern 114b may completely fill the groove 108, and may extend beyond the groove 108 to include portions thereof along the horizontal portions of the preliminary seed metal layer 112. In other words, the sacrificial pattern 114b may project upward along a vertical direction, e.g., the y-axis, above the groove 108, i.e., above the horizontal portions of the preliminary seed metal layer 112. An upper portion of the sacrificial pattern 114b, i.e., a portion above the groove 108, may be wider than the groove 108 along the horizontal direction. In this respect, it is noted that a width of the groove 108 may be measured as a horizontal distance along the x-axis between two facing sidewalls of adjacent portions of the mold layer 106. A width of the upper portion of the sacrificial pattern 114b may be measured as a horizontal distance along the x-axis between two opposing sidewalls of the upper portion of the sacrificial pattern 114b, i.e., a width L illustrated in FIG. 9. Formation of the sacrificial pattern 114b to have the width L may facilitate adjustment of the width L to control an exposure degree of the preliminary seed metal layer 112. Thus, it may be possible to adjust coverage of horizontal portions of the preliminary seed metal layer 112 by the sacrificial pattern 114b in order to control removal rates of the exposed preliminary seed metal layer 112.

Remaining stages in the method of manufacturing metal interconnections of a semiconductor device may be substantially the same as those described previously with reference to FIGS. 6-8. Accordingly, as described previously with reference to FIG. 6, the seed metal layer 112a may be spaced apart from the sidewalls of the groove 108, and may be easily formed on the bottom surface of the groove 108.

Figure 10:
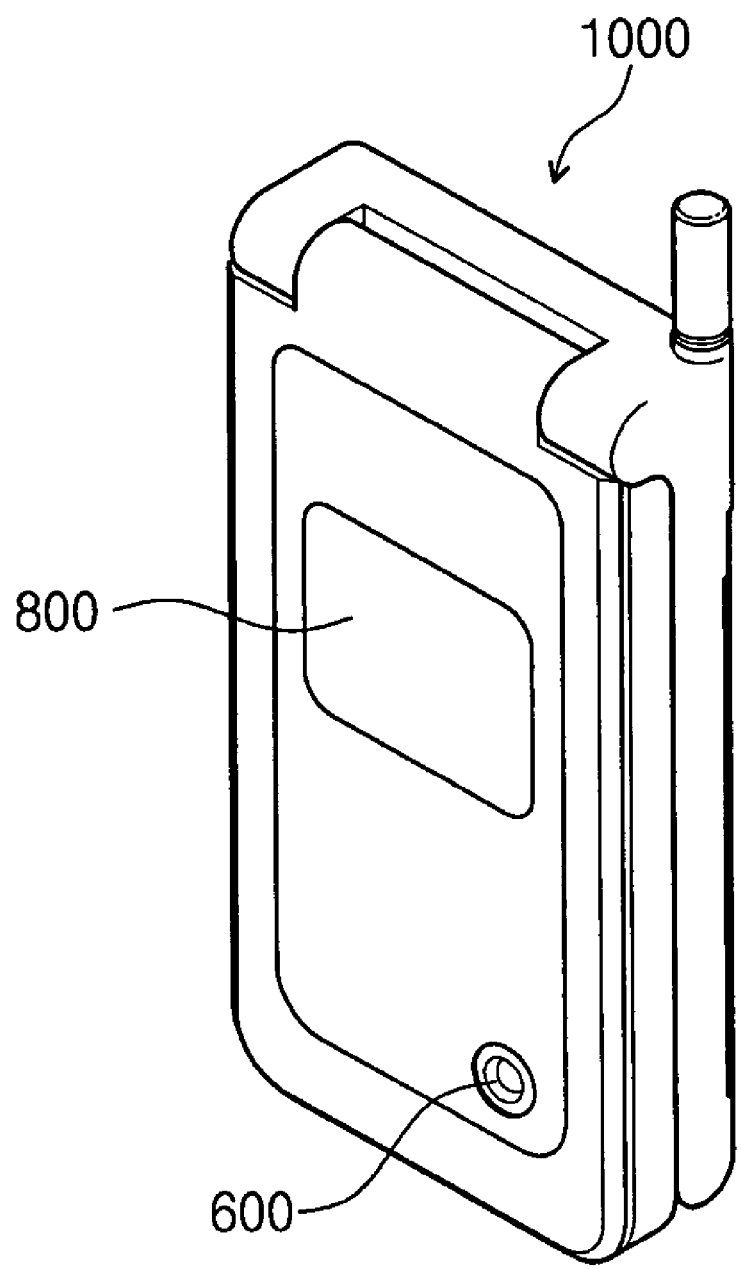
FIG. 10 illustrates a perspective view of an electronic device including a semiconductor device with a metal interconnection according to an example embodiment.

According to another example embodiment, metal interconnections 120 formed according to processes described previously with reference to FIGS. 1-9 may be used in any suitable electronic device as will be described in more detail below with reference to FIG. 10. FIG. 10 illustrates a perspective view of an electronic device including a semiconductor device with a metal interconnection 120.

Referring to FIG. 10, an electronic device, e.g., a mobile telephone, a camera, etc., may include a camera module 600 and a display 800 in a portable terminal 1000. The camera module 600 may convert a light signal into a shot image signal, and may convert the shot image signal into an image signal output the converted image signal. The display 800 may visually display an image of an object photographed by the camera module 600. The portable terminal 1000 may include the metal interconnections 120. Therefore, operation characteristics and reliability of the portable terminal 1000 may be improved. The electronic device may include personal portable information terminals, e.g., a camera phone, a digital camera, and so forth, personal computers, e.g., a desktop computer, a notebook computer, and so forth, in addition to the portable terminal 1000.

According to example embodiments, it may be possible to fundamentally prevent the under-cut phenomenon from being generated in the lower portion of the plating layer, e.g., metal pattern 116. Therefore, a semiconductor device with metal interconnections according to an example embodiment may have improved reliability. Further, time delay due to parasitic capacitance between adjacent metal interconnections mat be reduced, so operation characteristics of the semiconductor device may be improved. In addition, a CMP process may be eliminated, so manufacturing costs may be reduced to improve productivity of the semiconductor device.

Exemplary embodiments of the present invention have been disclosed herein, and although specific terms may be employed, they may be used and may be to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a metal interconnection of a semiconductor device, the method comprising:
   forming a base layer with at least one groove, the at least one groove having an open upper portion;
   forming a first metal layer in the at least one groove, the first metal layer including a first portion covering a bottom surface of the at least one groove and a second portion covering sidewalls of the at least one groove;
   forming a seed metal layer on the first metal layer in the at least one groove, the seed metal layer being only on the bottom surface of the at least one groove, and the seed metal layer including sidewalls spaced apart from the second portion of the first metal layer covering the sidewalls of the at least one groove; and
   forming a metal pattern grown from the seed metal layer to fill the at least one groove; wherein forming the seed metal layer includes:
      forming a preliminary seed metal layer on the first metal layer;
      forming a sacrificial pattern to fill the at least one groove;
      selectively removing a portion of the preliminary seed metal layer using the sacrificial pattern as an etch mask to form the seed metal layer only on the bottom surface of the at least one groove and to form the sidewalls of the seed metal layer spaced apart from the second portion of the first metal layer covering the sidewalls of the at least one groove; and
      removing the sacrificial pattern.

2. The method as claimed in claim 1, further comprising:
   forming an electrode on a substrate, wherein:
   the at least one groove is formed through the base layer to expose an upper surface of the electrode; and
   the first metal layer is conformally formed on the bottom surface and sidewalls of the at least one groove, and the first metal layer contacts the electrode.

3. The method as claimed in claim 2, further comprising removing the base layer and a portion of the first metal layer on an upper surface of the base layer to form a conductive pattern surrounding a lower portion and side portions of the metal pattern.

4. The method as claimed in claim 3, wherein the conductive pattern is formed of one or more of titanium (Ti), titanium nitride (TiN), tungsten (W), tungsten nitride (WN), tantalum (Ta), tantalum nitride (TaN), and rubidium (Rb), and the metal pattern is formed of one or more of copper (Cu), nickel (Ni), and gold (Au).

5. The method as claimed in claim 2, wherein forming the base layer includes using a non-photosensitive material or a photosensitive material.

6. The method as claimed in claim 1, wherein the preliminary seed metal layer has an etching selectivity relative to the first metal layer and the sacrificial pattern.

7. The method as claimed in claim 1, wherein:
   the at least one groove is formed through the base layer to expose an upper surface of an electrode; and
   the selectively removing the portion of the preliminary seed metal layer includes completely removing the preliminary seed metal layer from the sidewalls of the at least one groove to expose a section of the first portion of the first metal layer covering the bottom surface of the groove, the exposed section of the first metal layer defining a space between the seed metal layer and the second portion of the first metal layer covering the sidewalls of the at least one groove.

8. The method as claimed in claim 1, wherein forming the sacrificial pattern includes:
   forming a sacrificial layer on the preliminary seed metal layer to fill the at least one groove; and
   selectively removing a portion of the sacrificial layer to expose a horizontal portion of the preliminary seed metal layer, the horizontal portion of the preliminary seed metal layer being on the base layer and external to the groove.

9. The method as claimed in claim 8, wherein forming the sacrificial pattern includes:
   forming the sacrificial layer by depositing a non-photosensitive material on the preliminary seed metal layer; and
   removing a portion of the non-photosensitive material to expose the horizontal portion of the preliminary seed metal layer, and an upper surface of the sacrificial pattern being substantially coplanar with an upper surface of the horizontal portion of the preliminary seed metal layer.

10. The method as claimed in claim 8, wherein forming the sacrificial pattern includes:
    forming the sacrificial layer by depositing a photosensitive material on the preliminary seed metal layer; and
    removing a portion of the photosensitive material to expose the horizontal portion of the preliminary seed metal layer, the sacrificial pattern extending beyond the groove to overlap a part of the horizontal portion of preliminary seed metal layer.

11. The method as claimed in claim 1, wherein forming the metal pattern includes growing the metal pattern from the seed metal layer by using an electroplating method or an electroless plating method.

12. The method as claimed in claim 1, wherein forming the seed metal layer only on the bottom surface of the at least one groove includes forming the seed metal layer to have a width smaller than a width of the bottom surface of the groove, the widths of the seed metal layer and bottom surface of the groove being measured along a horizontal direction.

13. The method as claimed in claim 1, wherein forming the metal pattern in the at least one groove includes forming the metal pattern to surround the sidewalls and an upper surface of the seed metal layer, and a portion of the metal pattern on the bottom surface of the groove is between the sidewall of the seed metal layer and the respective second portion of the first metal layer covering sidewalls of the at least one groove.

14. The method as claimed in claim 1, wherein after selectively removing the portion of the preliminary seed metal layer, a width of the sacrificial pattern is substantially the same as a width of the seed metal layer, the widths of the sacrificial pattern and the seed metal layer being measured along a horizontal direction.

15. A method of manufacturing a metal interconnection of a semiconductor device, the method comprising:
    forming a base layer with at least one groove, the at least one groove having an open upper portion;
    forming a first metal layer of a first metal in the at least one groove, the first metal layer including a first portion covering a bottom surface of the at least one groove and a second portion covering sidewalls of the at least one groove;
    forming a seed metal layer of a second metal different from the first metal on the first metal layer in the at least one groove, the seed metal layer being only on the bottom surface of the at least one groove, and the seed metal layer including sidewalls spaced apart from the second portion of the first metal layer covering the sidewalls of the at least one groove; and forming a metal pattern grown from the seed metal layer to fill the at least one groove, the metal pattern being surrounded by the first metal layer within the groove, wherein forming the seed metal layer includes:
  forming a second metal layer on the first metal layer;
  forming a mask pattern to cover a portion of the second metal layer on the bottom surface of the groove;
  selectively removing a portion of the second metal layer using the mask pattern as an etch mask to form the seed metal layer on the bottom surface of the at least one groove under the mask pattern; and
  removing the mask pattern.

16. The method as claimed in claim 15, wherein the second metal layer has an etching selectivity relative to the first metal layer and the mask pattern.

17. The method as claimed in claim 15, wherein forming the metal pattern includes plate-growing the second metal from the seed metal layer toward the open upper portion of the groove.

* * * * *